(12) United States Patent
Tobise et al.

(10) Patent No.: US 6,229,399 B1
(45) Date of Patent: May 8, 2001

(54) MULTIPLE FREQUENCY BAND SYNTHESIZER USING A SINGLE VOLTAGE CONTROL OSCILLATOR

(75) Inventors: Daisuke Tobise, Yokohama; Hisashi Adachi, Osaka; Hidenobu Kato, Yokohama, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/060,145

(22) Filed: Apr. 15, 1998

(30) Foreign Application Priority Data

Apr. 25, 1997 (JP) .................................................... 9-121483

(51) Int. Cl.⁷ .............................. H03L 7/08; H03L 7/085; H03L 7/099; H03L 7/18
(52) U.S. Cl. .................................. 331/17; 331/2; 331/16; 331/18; 331/25; 327/147; 327/156; 375/376; 455/260
(58) Field of Search ............................. 331/2, 4, 16, 17, 331/18, 25, DIG. 2; 327/105, 147–150, 156–159; 455/260; 375/376

(56) References Cited

U.S. PATENT DOCUMENTS

| | | | |
|---|---|---|---|
| 3,710,274 | * | 1/1973 | Basse et al. .......................... 331/1 A |
| 3,729,688 | * | 4/1973 | Cerny, Jr. et al. .................... 331/1 A |
| 4,510,461 | * | 4/1985 | Dickes et al. ........................ 331/1 A |
| 4,629,999 | * | 12/1986 | Hatch et al. .......................... 331/1 R |
| 4,862,296 | * | 8/1989 | Murabayashi ......................... 360/51 |
| 5,420,545 | * | 5/1995 | Davis et al. ........................... 331/17 |
| 5,471,661 | * | 11/1995 | Atkinson ............................. 455/165.1 |
| 5,576,666 | * | 11/1996 | Rauvola ............................... 331/25 |
| 5,675,292 | * | 10/1997 | McCune, Jr. .......................... 331/17 |
| 5,686,864 | * | 11/1997 | Martin et al. ........................ 331/1 A |
| 5,729,179 | * | 3/1998 | Sumi ..................................... 331/12 |

FOREIGN PATENT DOCUMENTS 6284037    10/1994   (JP) .

* cited by examiner

Primary Examiner—David Mis
(74) Attorney, Agent, or Firm—Connolly Bove Lodge & Hutz

(57) ABSTRACT

A multiband PLL frequency synthesizer is disclosed which includes: a reference signal generation circuit for generating a reference signal of which frequency is controlled; a phase comparator for generating a phase difference signal; a low-pass filter circuit for low-pass-filtering the phase difference signal with one of a plurality of cutoff frequencies selected; a VCO for generating and outputting a LO signal according to an output of the low-pass filter; a frequency dividing circuit having an integer frequency dividing mode and a fraction frequency dividing mode to supply the frequency-divided signal to the phase comparator; and a control circuit for supplying the reference frequency control signal to the reference signal generation circuit, a filter control signal to the low-pass filter circuit, and frequency dividing control signal (data) to the frequency dividing circuit in accordance with a frequency command signal. The cutoff frequencies and the frequency dividing mode are selected to control the loop condition in accordance with the frequency command signal.

10 Claims, 5 Drawing Sheets

MULTIPLE FREQUENCY BAND SYNTHESIZER USING A SINGLE VOLTAGE CONTROL OSCILLATOR

BACKGROUND OF THE INVENTION

1. Field of the Invention

This invention relates to a multiband PLL frequency synthesizer for generating a frequency signal over a plurality of bands.

2. Description of the Prior Art

A multiband PLL frequency synthesizer for generating a frequency signal over a plurality of bands is known.

FIG. 7 is a block diagram of a prior art multiband PLL (phase-locked loop) frequency synthesizer. This prior art multiband PLL frequency synthesizer includes three PLL frequency synthesizing circuits 313, 314, and 315. The PLL frequency synthesizing circuits 313, 314, and 315 generate frequency signals at different bands respectively. FIG. 8 is an illustration of the prior art showing an example of using the prior art multiband PLL frequency synthesizer shown in FIG. 7. In FIG. 8. the PLL frequency synthesizing circuits 313, 314, and 315 generate frequency signals at bands f1 to f2, f3 to f4, and f5 to f6 respectively. A switch 316 outputs one of the frequency signals from the PLL frequency synthesizing circuits 313, 314, and 315.

In this circuit, there are many parts used because three similar circuits are used.

SUMMARY OF THE INVENTION

The aim of the present invention is to provide a superior multiband PLL frequency synthesizer.

According to the present invention there is provided a first PLL frequency synthesizer which includes: a reference signal generation circuit for generating a reference signal of which frequency is controlled in accordance with a reference frequency control signal; a phase comparing circuit for phase-comparing a frequency-divided signal with the frequency reference signal to output a phase difference signal; a low-pass filter circuit for low-pass-filtering the phase difference signal with one of a plurality of cut-off frequencies selected in response to the filter control signal; a voltage controlled oscillation circuit for generating and outputting an oscillation signal in accordance with an output of the low-pass filter circuit; a frequency dividing circuit for frequency-dividing the oscillation signal and supplying the frequency-divided signal to the phase comparing circuit; and a control circuit for generating the reference frequency control signal and the filter control signal in accordance with a frequency command signal.

In the first PLL frequency synthesizer, the frequency dividing circuit frequency-divides the oscillation signal in first and second modes in accordance with a frequency dividing control signal, the frequency dividing circuit frequency-dividing the oscillation signal by an integer in the first mode and frequency-dividing the oscillation signal in the second mode such that the oscillation signal is divided by a fraction using control data, the control circuit further generating the frequency dividing control signal, the integer, and control data in accordance with the frequency command signal. In this case, the frequency dividing circuit includes a frequency divider supplied with the integer and a dividing control circuit for controlling the frequency divider in the second mode such that the integer is periodically varied in accordance with the frequency dividing control signal.

In the first PLL frequency synthesizer, the low-pass filter circuit comprises a loop filter for charging and discharging a constant current for a phase difference interval represented by the phase difference signal and a switch controlled in response the filter control signal, one terminal of the switch being supplied with the phase difference signal, and a filter circuit including a first capacitor of which one terminal is connected the other terminal of the switch, the other terminal of the first capacitor being connected to the ground, and a series circuit including a resistor and a second capacitor, one end of the series circuit being connected to the other terminal of the switch and the other end of the series circuit being connected to the ground.

In the first PLL frequency synthesizer, the voltage controlled oscillation circuit includes a plurality of oscillation circuits, the oscillation signal is outputted by one of a plurality of the oscillation circuits in accordance with an oscillation control signal, the control circuit further generating the oscillation control signal in accordance with the frequency command signal.

According to the present invention there is provided a second PLL frequency synthesizer which includes: a reference signal generation circuit for generating a reference signal of which frequency is controlled in accordance with a reference frequency control signal; a phase comparing circuit for phase-comparing a frequency-divided signal with the frequency reference signal to output a phase difference signal; a low-pass filter circuit for low-pass-filtering the phase difference signal; a voltage controlled oscillation circuit for generating and outputting an oscillation signal in accordance with an output of the low-pass filter circuit; a frequency dividing circuit for frequency-dividing the oscillation signal in first and second modes in accordance with a frequency dividing control signal, the frequency dividing circuit frequency-dividing the oscillation signal by an integer in the first mode and frequency-dividing the oscillation signal in the second mode such that the oscillation signal is divided by a fraction, and supplying the frequency-divided signal to the phase comparing circuit; and a control circuit for generating the reference frequency control signal and the frequency dividing control signal in accordance with a frequency command signal.

In the second PLL frequency synthesizer, the frequency dividing circuit includes a frequency divider supplied with the integer and a dividing control circuit for controlling the frequency divider in the second mode such that the integer is periodically varied in accordance with the frequency dividing control signal.

In the second PLL frequency synthesizer, the low-pass-filtering circuit low-pass-filters the phase difference signal with one of a plurality of cut-off frequencies selected in response to a filter control signal and the control circuit further generates the filter control signal in accordance with the frequency command signal. In this case, the low-pass filter circuit includes a loop filter for charging and discharging a constant current for a phase difference interval represented by the phase difference signal and a switch controlled in response to the filter control signal, one terminal of the switch being supplied with the phase difference signal, and a filter circuit including a first capacitor of which one terminal is connected to the other terminal of the switch, the other terminal of the first capacitor being connected to the ground, and a series circuit including a resistor and a second capacitor, one end of the series circuit being connected to the other terminal of the switch and the other end of the series circuit being connected to the ground.

In the second PLL frequency synthesizer, the voltage controlled oscillation circuit includes a plurality of oscillation circuits, the oscillation signal is outputted by one of a plurality of the oscillation circuits selected in accordance with an oscillation control signal, the control circuit further generating the oscillation control signal in accordance with the frequency command signal.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
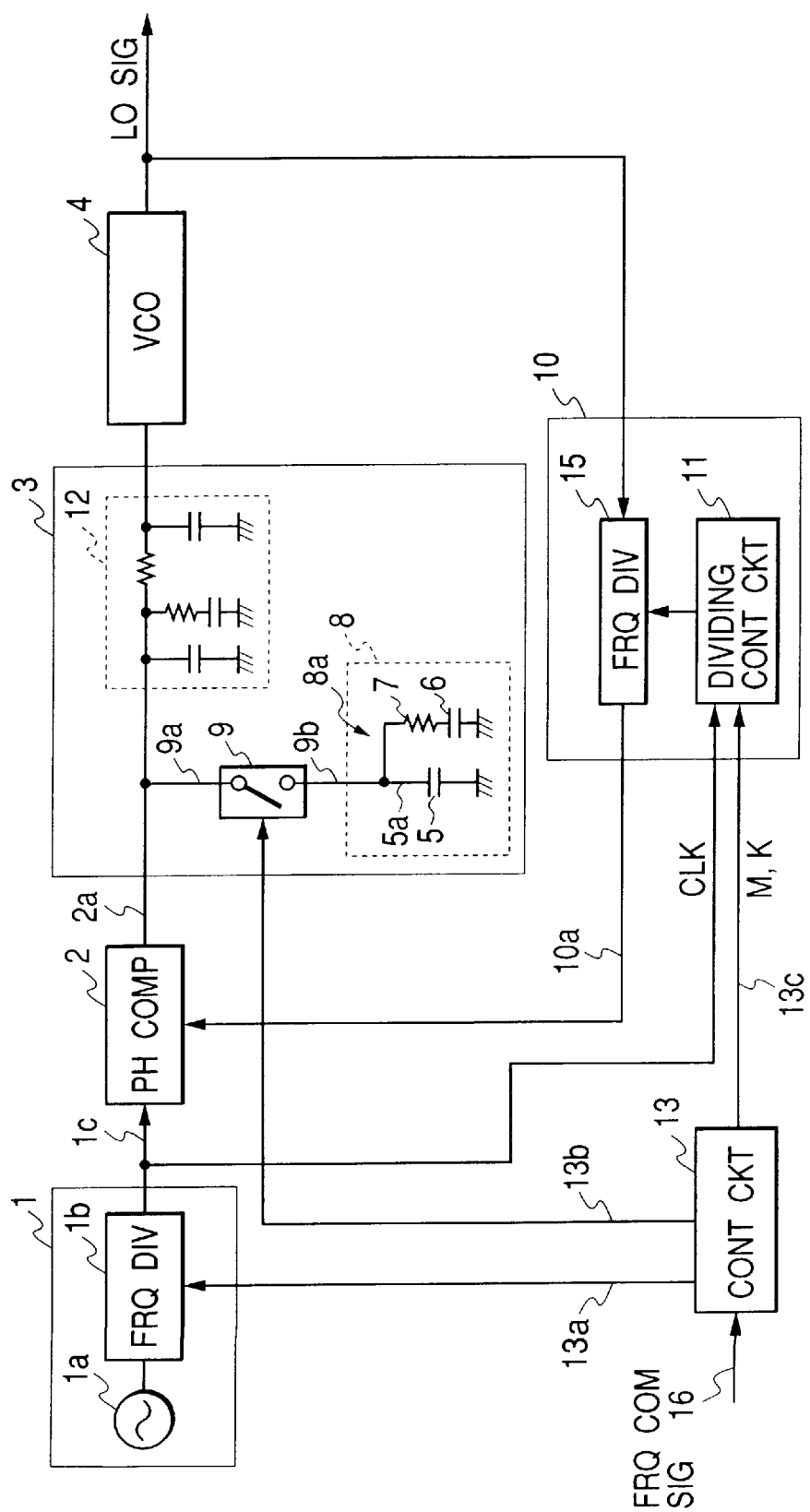
FIG. 1 is a block diagram of a multiband PLL frequency synthesizer of a first embodiment.

FIG. 1 is a block diagram of a multiband PLL frequency synthesizer of a first embodiment.

The multiband PLL frequency synthesizer of the first embodiment includes a frequency reference signal generation circuit 1 for generating a frequency reference signal (clock signal) 1c of which frequency is controlled in accordance with a reference frequency control signal 13a, a phase comparator 2 for phase-comparing a frequency-divided signal 10a with the frequency reference signal 1c to output a phase difference signal 2a, a low-pass filter 3 for low-pass-filtering the phase difference signal 2a with one of a plurality of cut-off frequencies selected in response to a filter control signal 13b, a voltage controlled oscillator 4 for generating and outputting an oscillation signal in accordance with an output of the low-pass filter 3, a frequency dividing circuit 10 for frequency-dividing the oscillation signal and supplying the frequency-divided signal 10a to the phase comparator 2, and a control circuit 13 for generating the reference frequency control signal 13a and the filter control signal 13b in accordance with a frequency command signal 16.

The frequency dividing circuit 10 frequency-divides the oscillation signal in first and second modes in accordance with a frequency dividing control signal 13c. The frequency dividing circuit 10 frequency-divides the oscillation signal by an integer M in the first mode and frequency-divides the oscillation signal in the second mode such that the oscillation signal is divided by a fraction. That is, in the first mode, an integer frequency dividing operation is effected and in the second mode, a fraction frequency dividing operation is effected. The control circuit 13 further generates and supplies the frequency dividing control signal 13c, the integer M, and a constant k for the fraction operation as control data in accordance with the frequency command signal 16. More specifically, the control circuit 13 generates the reference frequency control signal 13a, the filter control signal 13b, the frequency dividing control signal 13c including the integer M and the constant k in accordance with the frequency command signal 16 using a ROM table included therein.

The low-pass filter 3 includes a loop filter 12 for charging and discharging a constant current for an interval corresponding to a phase difference interval represented by the phase difference signal 2a and a switch 9 controlled in response to the filter control signal 13b and a filter circuit 8. One terminal 9a of the switch 9 is supplied with the phase difference signal 2a. The filter circuit 8 includes a first capacitor 5 of which one terminal 5a is connected to the other terminal 9b of the switch 9 and of which the other terminal is connected to the ground, and a series circuit 8a including a resistor 7 and a second capacitor 6. One end of the series circuit 8a is connected to the other terminal 9b of the switch 9 and the other end of the series circuit 8a is connected to the ground.

Figure 2:
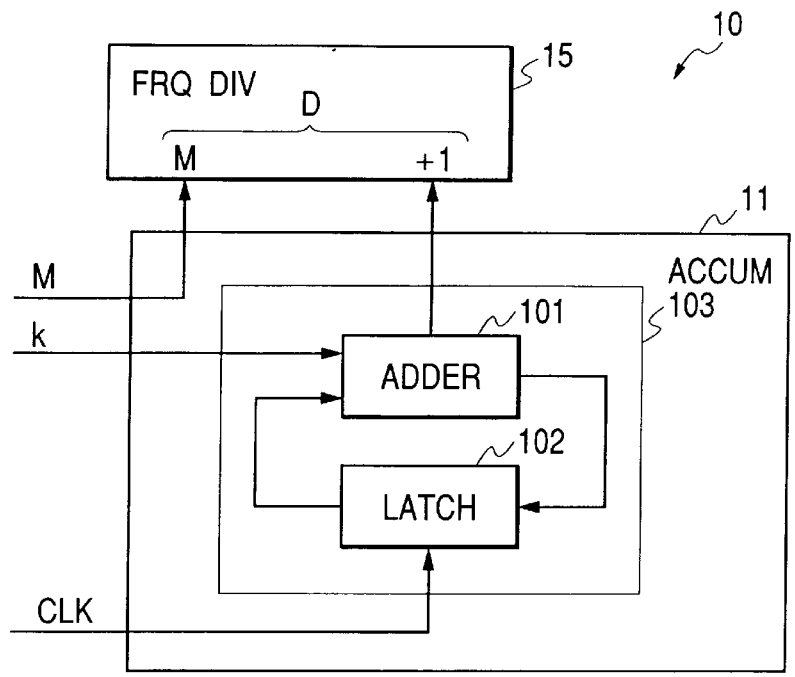
FIG. 2 is a block diagram of a frequency dividing circuit shown in FIG. 1.

FIG. 2 is a block diagram of a frequency dividing circuit 10 shown in FIG. 1.

The frequency dividing circuit 10 includes a frequency divider 15 supplied with the integer M and a dividing control circuit 11 for controlling the frequency divider 15 in the second mode such that the integer M is periodically varied in accordance with the constant k in the frequency dividing control signal 13c.

An operation of the first embodiment will be described.

The reference signal generation circuit 1 generates the frequency reference signal (clock signal) 1c. The frequency of the frequency reference signal is controlled in accordance with the reference frequency control signal 13a.

The phase comparator 2 compares a phase of the frequency-divided signal 10a with a phase of the frequency reference signal 13a and supplies the phase difference signal 2a to the low-pass filter 3.

The low-pass filter 3 effects low-pass-filtering of the phase difference signal 2a. The cut-off frequency is selected from a plurality of the cut-off frequencies in response to the filter control signal 13b. More specifically, the loop filter 12 of the low-pass filter 3 charges and discharges a constant current for the interval corresponding to the phase difference interval represented by the phase difference signal 2a, so that a cutoff frequency, that is, a cutoff angular frequency $\omega_{n1}$ is provided. When the switch 9 is closed in response the filter control signal 13b, the filter circuit 8 is added to the input of the loop filter 12, so that the filter circuit 8 acts as a part of the loop filter 12. It is assumed that the cutoff frequency of the filter circuit 8 is lower than that of the loop filter 12, that is, the passband of the filter circuit 8 is narrower than that of the loop filter 12. Then, when the switch 9 is closed, the cutoff angular frequency $\omega_n$ of the PLL loop is lower than that when the switch is open, so that the passband of the filter circuit 3 can be varied in accordance with the filter control signal 13b.

The voltage controlled oscillator 4 generates and outputs the oscillation signal in accordance with an output of the low-pass filter 3 and outputs a local oscillation signal as the output of the multiband PLL frequency synthesizer of the first embodiment.

The frequency dividing circuit 10 effects frequency-dividing of the oscillation signal and supplies the frequency-divided signal 10a to the phase comparator 2, so that the PLL feedback loop is provided.

The frequency dividing circuit 10, in the first mode, effects the integer frequency dividing operation and in the second mode, effects the fraction frequency dividing operation such that the oscillation signal is divided by a fraction.

More specifically, the frequency dividing circuit 10 includes the frequency divider 15 and a dividing control circuit 11. The dividing control circuit 11 includes an accumulator 103 having an adder 101 and a latch 102.

The dividing control circuit 11 controls a divisor D for the frequency divider 15 to provide the fraction frequency dividing operation in the second mode such that the divisor D is varied periodically to equivalently provide a fraction of the divisor.

Figure 3:
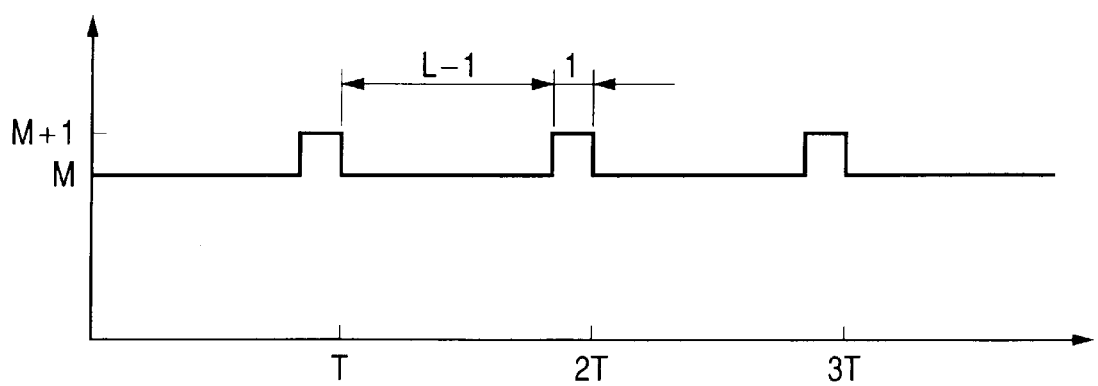
FIG. 3 is a time chart of the first embodiment showing an operation of the frequency dividing circuit shown in FIG. 1.

FIG. 3 is a time chart of the first embodiment showing an operation of the frequency dividing circuit 10 shown in FIG. 1.

Assuming that a period 1/fr of the frequency reference signal 1c is one clock CLK, the divisor D varies from the integer M to M+1 every L clocks (interval T), so that an average of the divisor D for the interval T is given by M+1/L. The fraction term 1/L can be treated as k/L and k is varied such that k=0, 1, 2, . . . , so that the divisor D can be set every step of 1/L. Then, the average divisor Mave is given by:

$$\text{Mave} = M + k/L \, (0 \leq k \leq L, \, k \text{ is an integer}) \quad (1)$$

This operation is provided by the accumulator 103 having an adder 101 and a latch 102. In FIG. 2, a value in the adder 101 increases by k every clock CLK which is the frequency reference signal 1c and when the adder overflows, the adder 101 supplies an overflow signal +1 to the frequency divider, and the divisor D becomes M+1. If the adder does not supply the overflow signal +1, the divisor D maintains the integer M.

This fraction frequency dividing operation expands the cutoff angular frequency ωn of the loop, so that the multi-band PLL frequency synthesizer of the first embodiment can operate at a higher speed than one that only had the integer frequency dividing operation.

Moreover, a combination of variation in the low-pass filter 3 and the variation in the frequency dividing circuit 10, that is, the combination of narrow passband and wide passband in the low-pass filter 3 and the integer frequency dividing operation and the fraction frequency dividing operation can provide three cutoff angular frequencies ωn of the loop as shown in TABLE 1.

TABLE 1

| LOWPASS FLT | NARROW | | WIDE | | WIDE |
|---|---|---|---|---|---|
| FRQ REF FRQ | LOW | | LOW | | HIGH |
| FRQ DIV OPE | INTEGER | | INTEGER | | FRACTION |
| CUTOFF ANG FRQ | ω n1 | < | ω n2 | < | ω n3 |

As shown in table 1, the voltage controlled oscillator output can be controlled by controlling only the cutoff frequency or controlled by switching the frequency dividing operation, or by a combination of the two. Moreover, as shown in table 1, it is possible that the oscillation signal is outputted from the voltage controlled oscillator at a plurality of frequency bands which may be intermittently arranged in the frequency base or may be continued in the frequency base.

As mentioned, the frequency of the local oscillation signal can be varied over a relatively wider range stably by adaptively varying the feedback loop condition, that is, the cutoff angular frequency and the frequency dividing operation, i.e., the integer frequency dividing operation and the fraction frequency dividing operation.

A second embodiment will be described.

Figure 4:
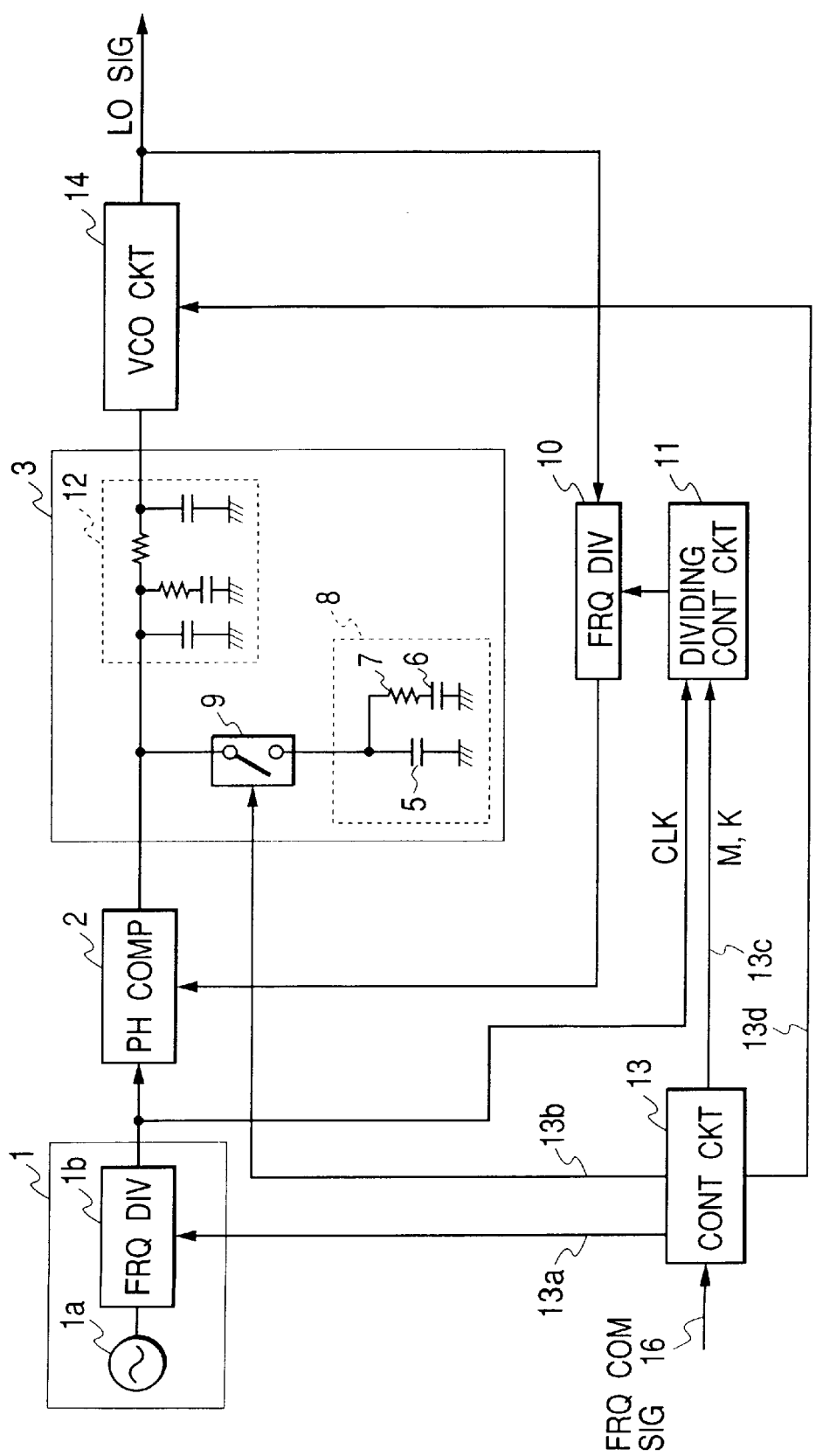
FIG. 4 is a block diagram of a multiband PLL frequency synthesizer of a second embodiment.

FIG. 4 is a block diagram of a multiband PLL frequency synthesizer of the second embodiment.

The multiband PLL frequency synthesizer of the second embodiment is substantially the same as that of the first embodiment. The difference is that a voltage controlled oscillation circuit 14 is used instead of the voltage controlled oscillator 4.

Figure 5:
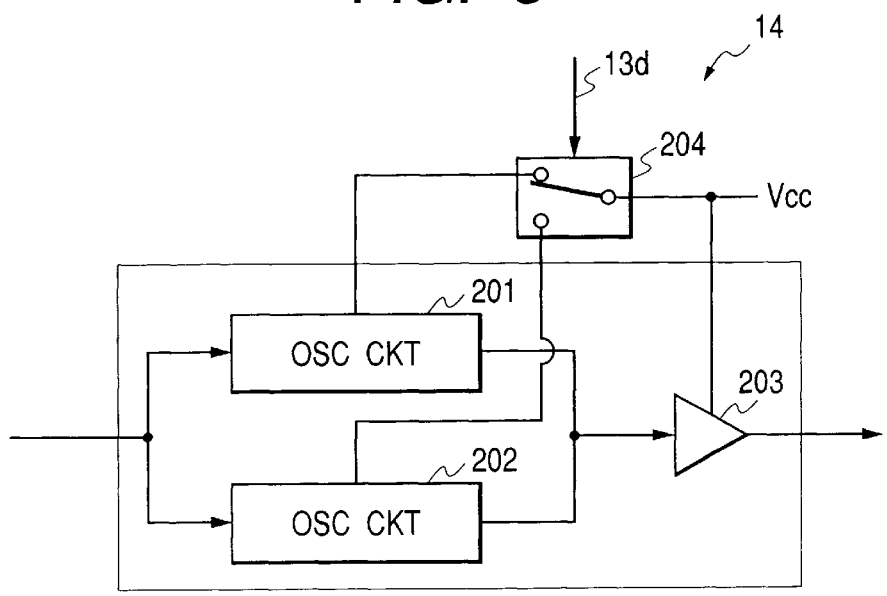
FIG. 5 is a block diagram of a voltage controlled oscillation circuit shown in FIG. 4.
Figure 6:
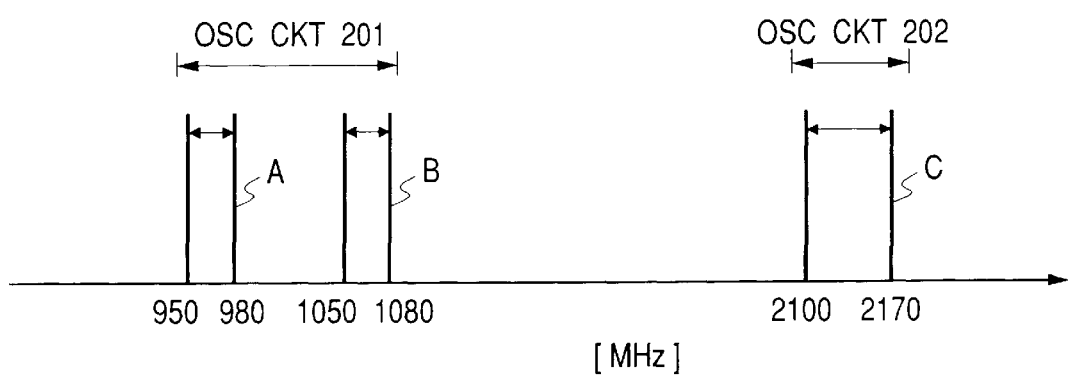
FIG. 6 is an illustration of the second embodiment showing an example of using the multiband PLL frequency synthesizer of the second embodiment.
Figure 7:
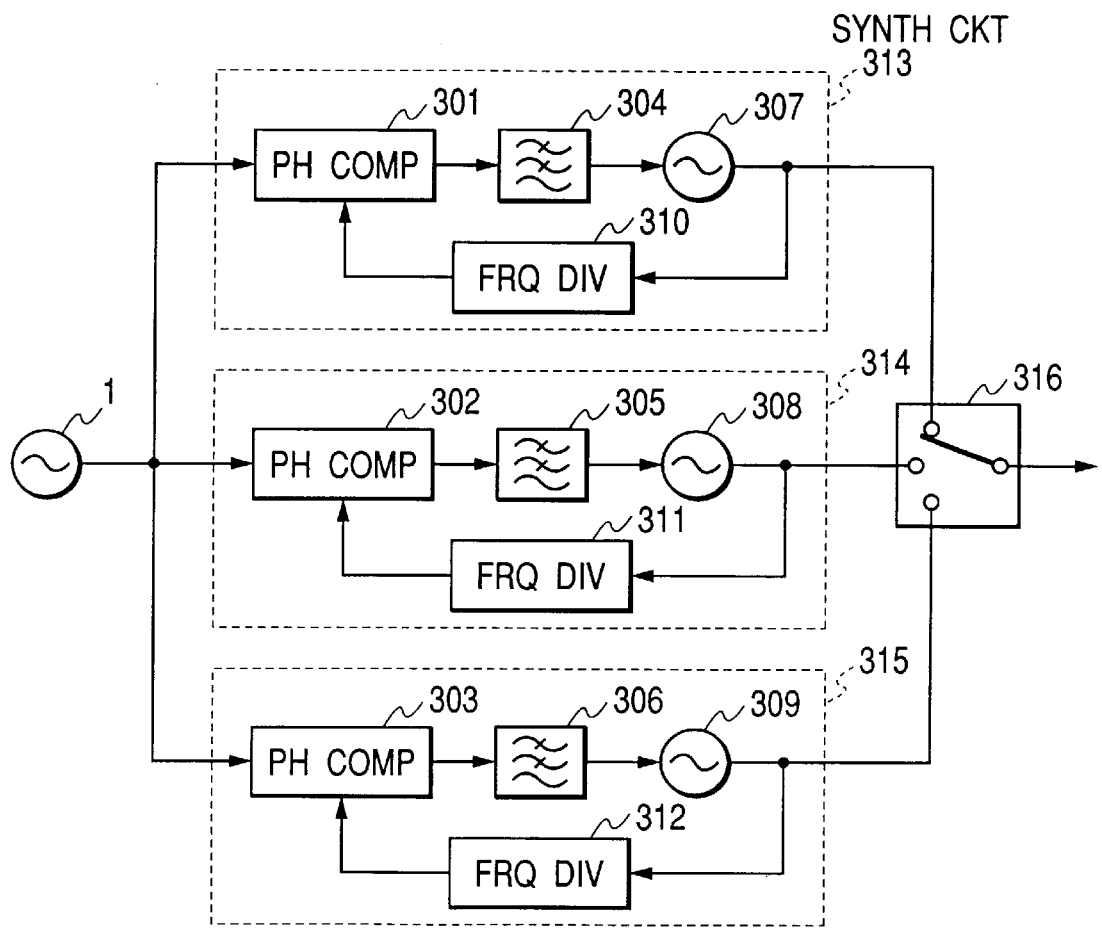
FIG. 7 is a block diagram of a prior art multiband PLL frequency synthesizer.
Figure 8:
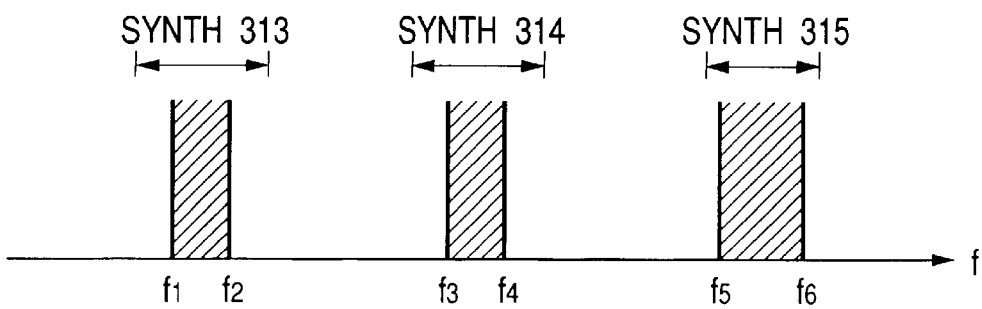
FIG. 8 is an illustration of the prior art showing an example of using the prior art multiband PLL frequency synthesizer shown in FIG. 7.

FIG. 5 is a block diagram of a voltage controlled oscillation circuit 14 shown in FIG. 4. FIG. 6 is an illustration of the second embodiment showing an example of using the multiband PLL frequency synthesizer of the second embodiment.

The voltage controlled oscillation circuit 14 includes a plurality of oscillation circuits 201 and 202. The local oscillation signal is outputted from one of a plurality of the oscillation circuits 201 and 202 in accordance with an oscillation control signal 13d from the control circuit 13. That is, the control circuit 13 further generates the oscillation control signal 13d in accordance with the frequency command signal 16.

The oscillation circuit 201 is used to oscillate at a range over two different frequency bands A and B. The oscillation circuit 202 is used to oscillate at further different frequency band C, wherein one of oscillation circuits 201 and 202 is operated in response to supplying a power Vcc via a switch 204. An amplifier 203 amplifies the output of either of the oscillation circuit 201 or 202 to output the local oscillation signal.

The oscillation circuit 201 is used to generate the local oscillation signal at either of frequency band A or B and the oscillation circuit 202 generates the local oscillation signal at a frequency band C. Therefore, the frequency of the local oscillation signal from the local oscillation circuit 14 is at either of the frequency band A, B, or C.

Table 2 shows designing data of the multiband PLL frequency synthesizer of the second embodiment.

TABLE 2

| | BAND A | BAND B | BAND C |
|---|---|---|---|
| VCO CONT SENSITIVITY KV [MHz/V] | 120 | 80 | 50 |
| PH COMP CONV GAIN K φ [mA/rad] | 1.59 | 1.59 | 1.59 |
| AVERAGE DIV | 32000 | 35000 | 43000 |
| LOOP GAIN K [A/V · s] | 5.96 | 3.63 | 1.85 |

As shown in table 2, in the oscillation circuit 201, the oscillation frequency band is wide, so that VCO controlling sensitivity is different, that is, it is 120 at the frequency band A and it is 80 at the frequency band B because a linearity of a variable capacitance diode (not shown) used in the oscillation circuit 201 is not maintained between the frequency bands A and B.

Moreover, because the loop gains K at respective frequency bands are different each other, if the reference frequency is constant and the cutoff frequency is not changed, it is difficult to provide the same characteristics at respective frequency bands A, B, and C.

More specifically, at frequency band C where the loop gain is lowest, the cutoff angular frequency ωn is low and increases in the order of the frequency band B and frequency band A. Then, similar to the first embodiment, the passband of the loop filter is varied and the frequency of frequency reference signal is varied (the frequency dividing mode is changed) every frequency bands to provide three cutoff angular frequencies ωn in only one PLL loop to optimize the PLL loop every frequency band.

Determination of respective constants in the multiband PLL synthesizer of the second embodiment will be described.

At first, in FIG. 4, the switch 9 is opened to put the low-pass filter in a broad band mode and the integer frequency dividing operation, that is, the first mode, is set. In this condition, respective constants in the loop filter 12 are determined to obtain a desired characteristic at the frequency band B where the loop gain is second largest. Then, with the frequency dividing mode maintained, that is in the first mode, the switch 9 is closed to put the low-pass filter 3 in a narrow band mode and then, constants of the capacitors 5 and 6, and the resistor 7 in the filter circuit 8 are determined to provide a desired characteristic at the frequency band A where the loop gain is largest. Finally, the switch 9 is opened, to provide the filter circuit 3 in a wide band condition, and then, the value of L supplied to the dividing control circuit 11 is determined at the frequency band C where the loop gain in smallest in the fraction frequency dividing operation mode, that is, the second mode.

As mentioned, at the frequency band where the loop gain is large, the reference frequency (frequency dividing mode) and the passbands of the low-pass filter 3 are determined to make the cutoff angular frequency ωn lower. On the other hand, at the frequency band where the loop gain is small, the reference frequency (frequency dividing mode) and the passbands of the low-pass filter 3 are determined to make the cutoff angular frequency ωn higher, so that only one PLL loop can provide substantially the same characteristic at respective frequency bands.

What is claimed is:

1. A PLL frequency synthesizer comprising:
    reference signal generation means for generating a reference signal of which frequency is controlled in accordance with a reference frequency control signal;
    phase comparing means for phase-comparing a frequency-divided signal with said frequency reference signal to output a phase difference signal;
    low-pass filter means for low-pass-filtering said phase difference signal with one of a plurality of cut-off frequencies selected in response to a filter control signal;
    voltage controlled oscillation means for generating and outputting an oscillation signal in a plurality of frequency bands in accordance with a band selection signal and an output of said low-pass filter means;
    frequency dividing means for frequency-dividing said oscillation signal and supplying said frequency-divided signal to said phase comparing means; and
    control means for generating said reference frequency control signal and said filter control signal in accordance with a frequency command signal, wherein said voltage-controlled oscillation means generates and outputs said oscillation signal at a plurality of frequency bands, said band selection signal being determined from a predetermined combination of said reference frequency control signal and said filter control signal.

2. The PLL frequency synthesizer as claimed in claim 1, wherein said frequency dividing means frequency-divides said oscillation signal in first and second modes in accordance with a frequency dividing control signal, said frequency dividing means frequency-dividing said oscillation signal by an integer in said first mode and frequency-dividing said oscillation signal in said second mode such that said oscillation signal is divided by a fraction using control data, said control means further generating said frequency dividing control signal, said integer, and control data in accordance with said frequency command signal.

3. The PLL frequency synthesizer as claimed in claim 2, wherein said frequency dividing means comprises a frequency divider supplied with said integer and a dividing control circuit for controlling said frequency divider in said second mode such that said integer is periodically varied in accordance with said frequency dividing control signal.

4. The PLL frequency synthesizer as claimed in claim 1, wherein said low-pass filter means comprises a loop filter for charging and discharging a constant current for a phase difference interval represented by said phase difference signal and a switch controlled in response said filter control signal, one terminal of said switch being supplied with said phase difference signal, and a filter circuit including a first capacitor of which one terminal is connected the other terminal of said switch, the other terminal of said first capacitor being connected to the ground, and a series circuit including a resistor and a second capacitor, one end of said series circuit being connected to the other terminal of said switch and the other end of said series circuit being connected to the ground.

5. The PLL frequency synthesizer as claimed in claim 1, wherein said voltage controlled oscillation means includes a plurality of oscillation circuits, said oscillation signal is outputted by one of a plurality of said oscillation circuits in accordance with an oscillation control signal, said control means further generating said oscillation control signal in accordance with said frequency command signal.

6. A PLL frequency synthesizer comprising:
    reference signal generation means for generating a reference signal of which frequency is controlled in accordance with a reference frequency control signal;
    phase comparing means for phase-comparing a frequency-divided signal with said frequency reference signal to output a phase difference signal;
    low-pass filter means for low-pass-filtering said phase difference signal;
    voltage controlled oscillation means for generating and outputting an oscillation signal in accordance with an output of said low-pass filter means;
    frequency dividing means for frequency-dividing said oscillation signal in first and second modes in accordance with a frequency dividing control signal, said frequency dividing means frequency-dividing said oscillation signal by an integer in said first mode and frequency-dividing said oscillation signal in said second mode such that said oscillation signal is divided by a fraction, and supplying said frequency-divided signal to said phase comparator; and
    control means for generating said reference frequency control signal and said frequency dividing control signal in accordance with a frequency command signal, wherein said voltage controlled oscillation means generates and outputs said oscillation signal at a plurality of frequency bands in cooperation with said frequency dividing means and said control means, a selected frequency band of said plurality being selected for output depending on said reference frequency control signal.

7. The PLL frequency synthesizer as claimed in claim 6, wherein said frequency dividing means comprises a frequency divider supplied with said integer and a dividing control circuit for controlling said frequency divider in said second mode such that said integer is periodically varied in accordance with said frequency dividing control signal.

8. The PLL frequency synthesizer as claimed in claim 6, wherein low-pass-filtering means low-pass-filters said phase difference signal with one of a plurality of cut-off frequencies selected in response to a filter control signal, said control means further generating said filter control signal in accordance with said frequency command signal.

9. The PLL frequency synthesizer as claimed in claim 8, wherein said low-pass filter means comprises a loop filter for charging and discharging a constant current for a phase difference interval represented by said phase difference signal and a switch controlled in response said filter control signal, one terminal of said switch being supplied with said phase difference signal, and a filter circuit including a first capacitor of which one terminal is connected the other terminal of said switch, the other terminal of said first capacitor being connected to the ground, a series circuit including a resistor and a second capacitor, one end of said series circuit being connected to the other terminal of said switch and the other end of said series circuit being connected to the ground.

10. The PLL frequency synthesizer as claimed in claim 6, wherein said voltage controlled oscillation means includes a plurality of oscillation circuits, said oscillation signal is outputted by one of a plurality of said oscillation circuits in accordance with an oscillation control signal, said control means further generating said oscillation control signal in accordance with said frequency command signal.

* * * * *